United States Patent
Wu et al.

(10) Patent No.: US 12,364,167 B2
(45) Date of Patent: Jul. 15, 2025

(54) SEMICONDUCTOR STRUCTURE INCLUDING TWO SHIELDING LAYERS AND MANUFACTURING METHOD THEREOF

(71) Applicant: CHANGXIN MEMORY TECHNOLOGIES, INC., Anhui (CN)

(72) Inventors: YuLei Wu, Hefei (CN); Baolei Wu, Hefei (CN); Xiaoguang Wang, Hefei (CN); Er-Xuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 526 days.

(21) Appl. No.: 17/593,874

(22) PCT Filed: Mar. 9, 2021

(86) PCT No.: PCT/CN2021/079674
§ 371 (c)(1),
(2) Date: Jul. 27, 2022

(87) PCT Pub. No.: WO2021/208637
PCT Pub. Date: Oct. 21, 2021

(65) Prior Publication Data
US 2023/0217837 A1    Jul. 6, 2023

(30) Foreign Application Priority Data
Apr. 16, 2020 (CN) .......................... 202010300660.7

(51) Int. Cl.
*H10N 50/00* (2023.01)
*H10B 61/00* (2023.01)
(Continued)

(52) U.S. Cl.
CPC .............. *H10N 50/80* (2023.02); *H10B 61/00* (2023.02); *H10N 50/01* (2023.02)

(58) Field of Classification Search
CPC ........ H10N 50/01; H10N 50/10; H10N 50/80; H01L 23/552
See application file for complete search history.

(56) References Cited

U.S. PATENT DOCUMENTS

2012/0199895 A1    8/2012  Nitta
2015/0091109 A1*   4/2015  Allinger ................ G11C 11/161
                                                        257/421

(Continued)

FOREIGN PATENT DOCUMENTS

| CN | 103443860 A | 12/2013 |
|---|---|---|
| CN | 104518080 A | 4/2015 |
| WO | WO 2021/208637 A1 | 10/2021 |

OTHER PUBLICATIONS

Search Report and Written Opinion mailed Jun. 16, 2021, English translation of Search Report.

(Continued)

*Primary Examiner* — Reema Patel
(74) *Attorney, Agent, or Firm* — Kilpatrick Townsend & Stockton LLP

(57) ABSTRACT

A method for manufacturing a semiconductor structure includes: providing a substrate; forming a first shielding layer on the substrate; forming a first electrode penetrating the first shielding layer; forming a storage structure on the first electrode; forming a second shielding layer on the top surface and sidewalls of the storage structure, wherein the first shielding layer and the second shielding layer combine into one integrated shielding layer; and forming a second electrode which penetrates the shielding layer and electrically connects to the storage structure.

15 Claims, 15 Drawing Sheets

(51) Int. Cl.
H10N 50/01 (2023.01)
H10N 50/80 (2023.01)

(56) References Cited

U.S. PATENT DOCUMENTS

2018/0316077 A1* 11/2018 Yamane .................... H01P 5/12
2019/0036014 A1* 1/2019 Ha ......................... H10N 50/10
2019/0221732 A1 7/2019 Houssameddine et al.

OTHER PUBLICATIONS

EP 21788560.7 Extended European Search Report mailed Jul. 13, 2023.
PCT/CN2021/079674 Search Report and Written Opinion mailed Jun. 16, 2021, English translation of Search Report.

* cited by examiner

SEMICONDUCTOR STRUCTURE INCLUDING TWO SHIELDING LAYERS AND MANUFACTURING METHOD THEREOF

CROSS REFERENCES TO RELATED APPLICATIONS

This application is an International Application which claims the benefit of priority to CN Patent Application CN 202010300660.7 filed on Apr. 16, 2020, entitled "Semiconductor Structure and Manufacturing Method Thereof", the contents of which are incorporated herein by reference in its entirety.

TECHNICAL FIELD

The present invention relates to the field of semiconductor technology, in particular to a semiconductor structure and a manufacturing method thereof.

BACKGROUND

Spin-transfer torque (STT) magnetic random-access memory (MRAM) is a kind of memory that writes information through spin current and can be used to flip the active elements in magnetic random-access memory. The core of its storage unit is a Magnetic Tunnel Junction (MTJ), which is composed of a magnetic stacked layer structure, a first electrode and a second electrode, wherein the magnetic stacked layer structure includes, stacked from top to bottom, a free layer, a spacer layer and a fixed layer, a second electrode located on top of the free layer, and a first electrode located on the bottom surface of the fixed layer.

However, STT-MRAM is susceptible to interference from external electromagnetic fields. The current chip-level shielding is not enough to completely shield the interference from external electromagnetic fields.

SUMMARY

According to various embodiments, a semiconductor structure and a manufacturing method thereof are provided to shield interference from external electromagnetic fields.

A method for manufacturing a semiconductor structure includes: providing a substrate; forming a first shielding layer on the substrate; forming a first electrode penetrating the first shielding layer; forming a storage structure on the first electrode; forming a second shielding layer on a top surface and side walls of the storage structure, the first shielding layer and the second shielding layer together combine to an integrated shielding layer.

A second electrode that penetrates the shielding layer and is electrically connected to the storage structure is formed.

In one of the embodiments, the storage structure includes a magnetic stacked layer structure.

In one of the embodiments, the step of forming the first electrode penetrating the first shielding layer includes: forming a first dielectric layer on the first shielding layer; forming a first opening in the first shielding layer and the first dielectric layer.

The first electrode is formed in the first opening.

In one of the embodiments, before the second shielding layer is formed on the top surface and sidewalls of the storage structure, the method further includes: a second dielectric layer on the top surface and sidewalls of the magnetic stacked layer structure is formed, and the first dielectric layer and the second dielectric layer together constitute an isolation layer.

In one of the embodiments, the materials of the first shielding layer and the second shielding layer include conductive materials and/or magnetically permeable materials.

In one of the embodiments, the materials of the first shielding layer and the second shielding layer are different; removing the first shielding layer except under the second shielding layer on the sidewall of the magnetic stacked layer structure by using a self-aligned etching process; the first shielding layer and the second shielding layer remaining under the second shielding layer on the sidewall of the magnetic stacked layer structure form the shielding layer.

In one of the embodiments, the bottom surface of the shielding layer is lower than the bottom surface of the magnetic stacked layer structure.

In one of the embodiments, the top of the magnetic stacked layer structure is arc-shaped.

In one of the embodiments, the lateral dimension of the magnetic stacked layer structure is larger than the lateral dimension of the first electrode.

In one of the embodiments, the step of forming a second electrode that penetrates the shielding layer and is electrically connected to the storage structure includes: forming a third dielectric layer on the substrate and the shielding layer; using a planarizing process to remove part of the shielding layer from above the magnetic stacked layer structure to expose the top of the magnetic stacked layer structure; forming a fourth dielectric layer on top of the magnetic stacked layer structure; and forming a second opening in the fourth dielectric layer and the opening exposing the top of the magnetic stacked layer structure.

The second electrode is formed in the second opening.

The embodiment of the present invention also provides a semiconductor structure, including: a substrate; a first electrode is located in the substrate; a storage structure located on the first electrode; a shielding layer on the top surface and sidewalls of the storage structure; and the bottom surface of the shielding layer is lower than the bottom surface of the storage structure; and the second electrode penetrates the shielding layer on the top part of the storage structure and is electrically connected to the storage structure.

In one of the embodiments, the storage structure includes a magnetic stacked layer structure.

In one of the embodiments, the magnetic stacked layer structure includes a fixed layer, a spacer layer and a free layer.

In one of the embodiments, the materials of the fixed layer and the free layer may be Co, Fe, B, Ta or Ru; the material of the spacer layer includes Mg or O.

In one of the embodiments, the top of the magnetic stacked layer structure is arc-shaped.

In one of the embodiments, it further includes: an isolation layer covering the magnetic laminate structure;

The isolation layer includes a first dielectric layer and a second dielectric layer.

The first dielectric layer is located between the shielding layer and the first electrode;

The second dielectric layer is located between the shielding layer and the magnetic laminated structure.

In one of the embodiments, the lateral dimension of the magnetic stacked layer structure is larger than the lateral dimension of the first electrode.

In one of the embodiments, the shielding layer includes a first shielding layer and a second shielding layer.

The first shielding layer is located between the first dielectric layer and the substrate, wherein one end of the first shielding layer is located in the projected area of the magnetic stacked layer structure on the substrate.

The second shielding layer is located on the outer surface of the sidewall of the first dielectric layer and the outer surface of the second dielectric layer.

In one of the embodiments, the materials of the first shielding layer and the second shielding layer include conductive materials and/or magnetically permeable materials; the materials of the first shielding layer and the second shielding layer are different.

In one of the embodiments, the bottom surface of the second electrode, the top surface of the magnetic stacked layer structure, the top surface of the shielding layer, and a top surface of the isolation layer are on the same level.

In summary, a semiconductor structure and a manufacturing method thereof are provided. By forming the first shielding layer first, and then sequentially forming the first electrode, the storage structure, and the second shielding layer, the first shielding layer and the second shielding layer form a shielding layer covering the storage structure. Good shielding of external electromagnetic field interference to the storage structure, ensuring that information can be stored and read and written correctly.

It should be understood that the above general description and the following detailed description are only exemplary and cannot limit the present disclosure.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

Figure 1:
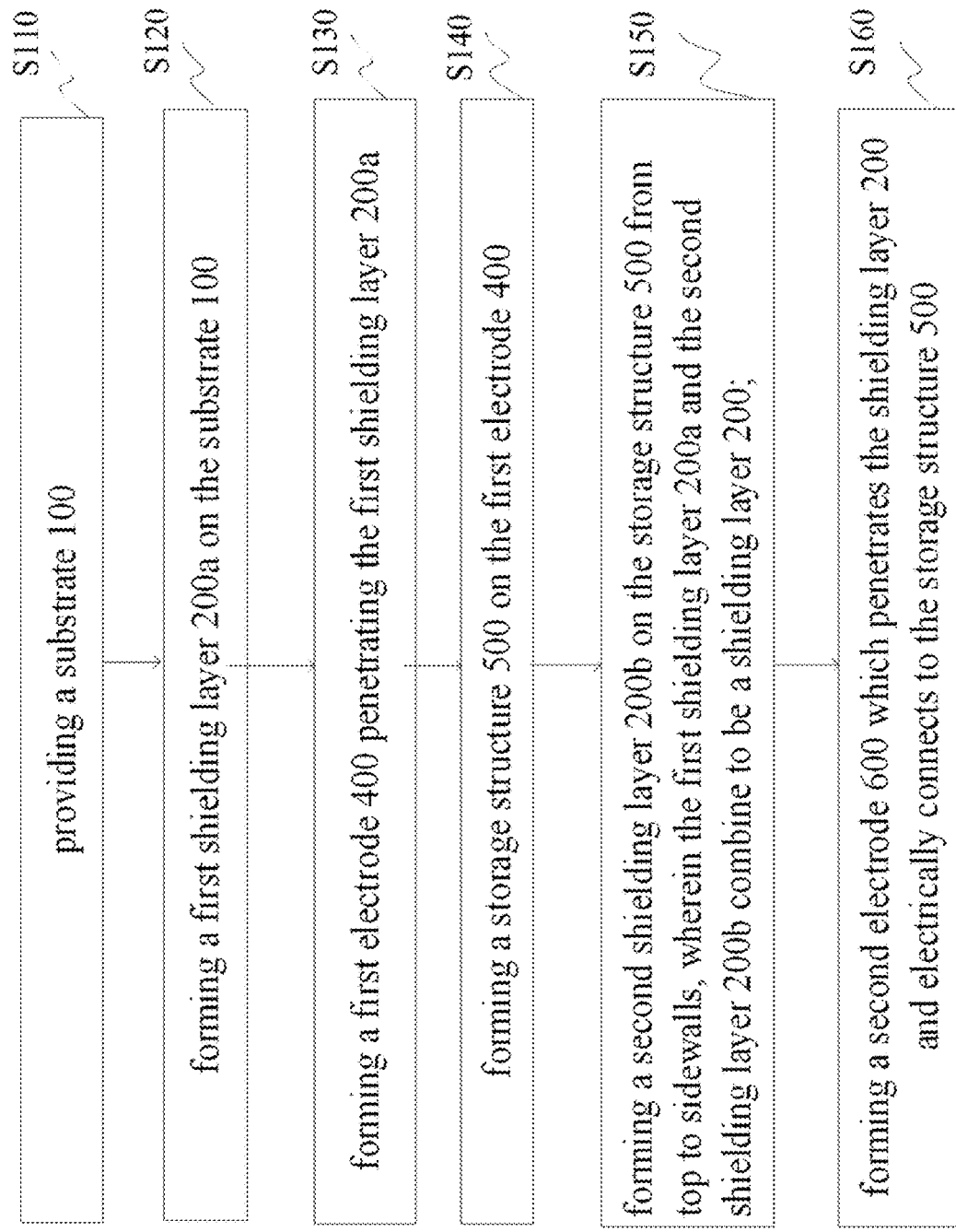
FIG. 1 is a flowchart of a method of manufacturing a semiconductor structure according to one embodiment of the disclosure.

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

The present disclosure effectively overcomes various disadvantages in the prior arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

In order to make the above structural features and methods making them with their advantages for the present disclosure more obvious and understandable, the specific embodiments of the present disclosure will be described in detail below with reference to the accompanying drawings. In the following description, many specific details are explained in order to fully understand the present invention. However, the present invention can be implemented in many other ways different from those described herein, and those skilled in the art can make similar improvements without departing from the connotation of the present invention. Therefore, the present invention is not limited by the specific implementation disclosed below.

Referring to FIG. 1, the flowchart provides a method for fabricating a semiconductor structure, the method includes:

Step S110, providing a substrate 100;

Step S120, forming a first shielding layer 200a on the substrate 100;

Step S130, forming a first electrode 400 penetrating the first shielding layer 200a;

Step S140, forming a storage structure 500 on the first electrode 400;

Step S150, forming a second shielding layer 200b on the storage structure 500 from top to sidewalls, wherein the first shielding layer 200a and the second shielding layer 200b together combine to a shielding layer 200; and In step S160, forming a second electrode 600 which penetrates the shielding layer 200 and electrically connects to the storage structure 500.

By forming the first shielding layer 200a first, and then sequentially forming the first electrode 400, the storage structure 500, and the second shielding layer 200b, the shielding layer 200 composed of the first shielding layer 200a and the second shielding layer 200b constitute the enclosing structure of the storage structure 500. This structure can better shield the storage structure from the interference of the external electromagnetic field, thus it is ensured that the information can be stored, read and written correctly.

To describe the technical features more clearly, the following paragraphs describe each step of the manufacturing process in detail according to the embodiments.

In this embodiment, step S110 provides the substrate 100. The substrate 100 can be one of, but not limited to, a silicon substrate, an epitaxially grown silicon substrate, a silicon germanium substrate, a silicon carbide substrate, or a silicon-on-insulator substrate, and another substrate known for carrying semiconductor integrated circuits. The base material of the element can be any. The substrate 100 may include device structures such as semiconductor transistors and interconnecting plugs connecting the semiconductor transistors.

Figure 2:
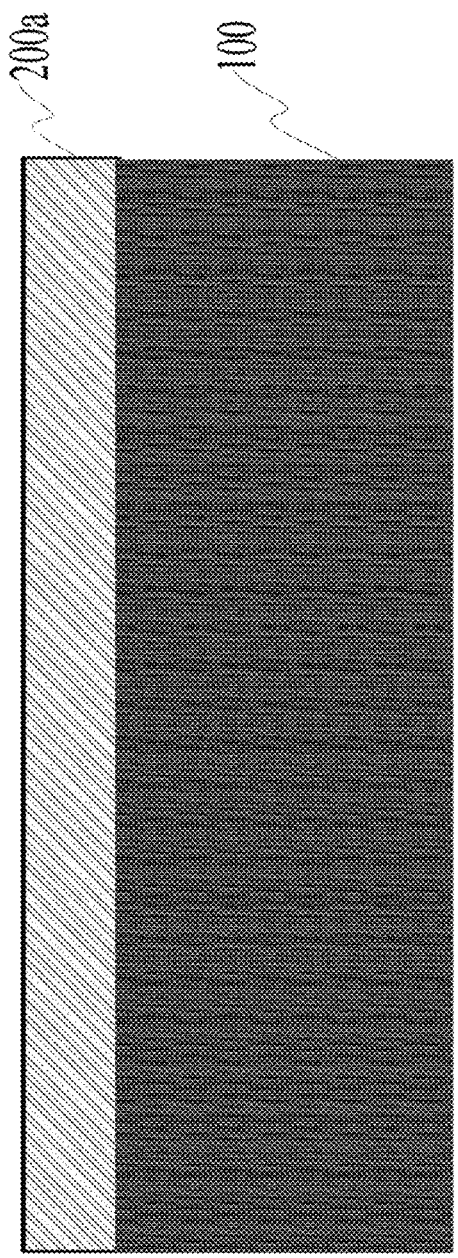
FIGS. 2 to 11 are schematic structural diagrams during formation of the semiconductor structure according to one a embodiment.

Referring to FIG. 2, in step S120, a first shielding layer 200a is formed on the substrate 100.

A shielding material is deposed on the substrate 100 through a deposition process to form a first shielding layer 200a. In this implementation, the deposition process includes chemical vapor deposition (CVD), physical vapor deposition (PVD), or atomic layer deposition (ALD). The shielding material can be a material with good conductivity, such as silver, copper, gold, etc., which will play a good shielding effect on the electric field; the shielding material may also be a material with good magnetic permeability, such as iron (Fe), cobalt (Co) and nickel (Ni) alloys, such as cobalt-iron, nickel-iron and nickel-cobalt-iron, or various combinations of NiFe and Co and other alloys with higher magnetic permeability, doped amorphous ferromagnetic alloys. It should be noted that the material with good conductivity can also play a certain shielding effect on the magnetic field, and the material with good magnetic permeability can also play a certain shielding effect on the electric field.

Figure 3:
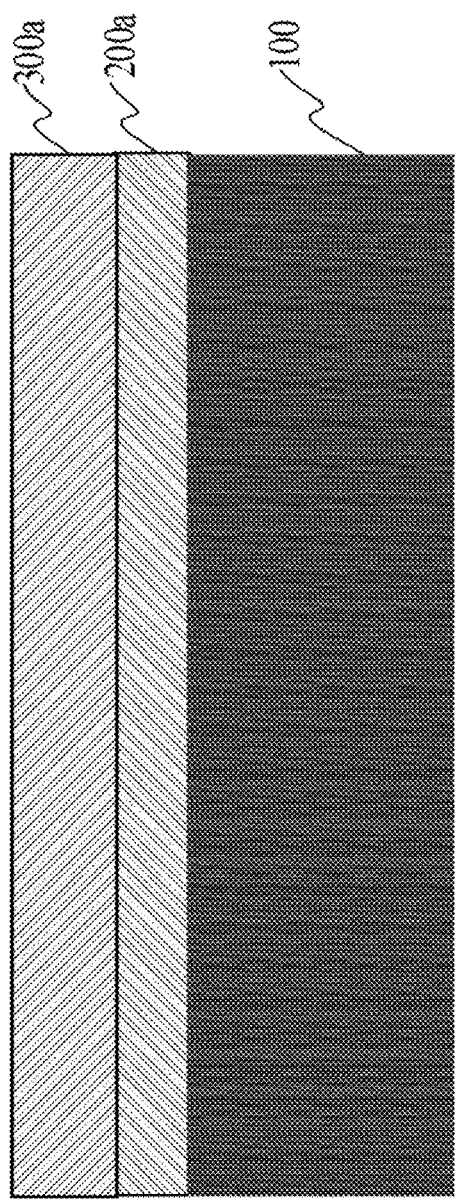

In one of the embodiments, referring to FIG. 3, a first dielectric layer 300a is further formed on the first shielding layer 200a. Specifically, a dielectric material such as silicon nitride, silicon oxide, or silicon oxynitride is deposed on the first shielding layer 200a through a deposition process to form the first dielectric layer 300a. The first dielectric layer 300a can be used as a hard mask for patterning the first shielding layer 200a, and can also be used as a part of an isolation layer between the first shielding layer 200a and a subsequently formed storage structure.

Figure 4:
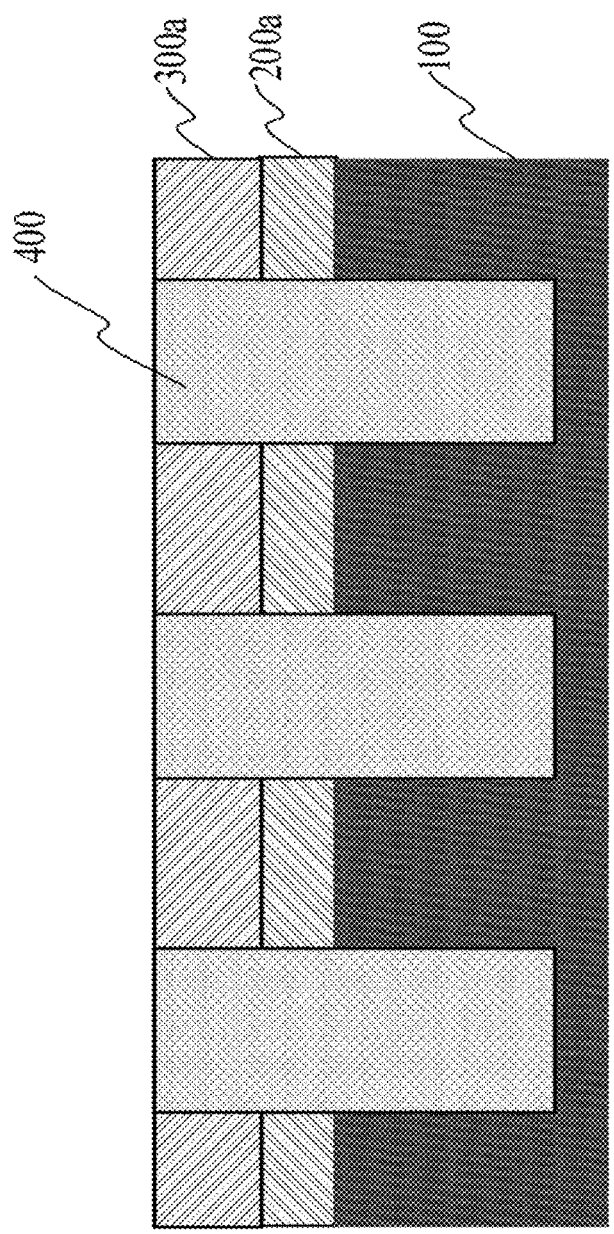

Referring to FIG. 4, step S130 is performed to form a first electrode 400 which penetrates the first shielding layer 200a. Specifically, a first opening (not shown in the figure) is formed in the first shielding layer 200a and the first dielectric layer 300a by applying photolithography and etching processes. The deposited first electrode layer fills the first opening and cover the first dielectric layer 300a. Specifically, the first electrode layer can be formed by physical vapor deposition, chemical vapor deposition, or electroplating. The first electrode layer is a conductive material layer, composing of a metal material layer with good conductivity such as aluminum (Al), tungsten (W), copper (Cu), etc.; the first electrode material deposited on the upper surface of the first dielectric layer 300a is then removed so only a layer in the first opening becomes the first electrode 400. Specifically, the first electrode material disposed covering the upper surface of the first dielectric layer 300a will be e removed either by an etch-back or a chemical mechanical polishing process to form the first electrode 400.

In one of the embodiments, the top surface of the first electrode 400 is flush with the top surface of the first dielectric layer 300a. It can be understood that when the top of the first electrode 400 is flush with the top of the first dielectric layer 300a, the bottom surface of the first shielding layer 200a is lower than the bottom surface of the subsequently formed storage structure, this arrangement increases the shielding range.

Figure 5A:
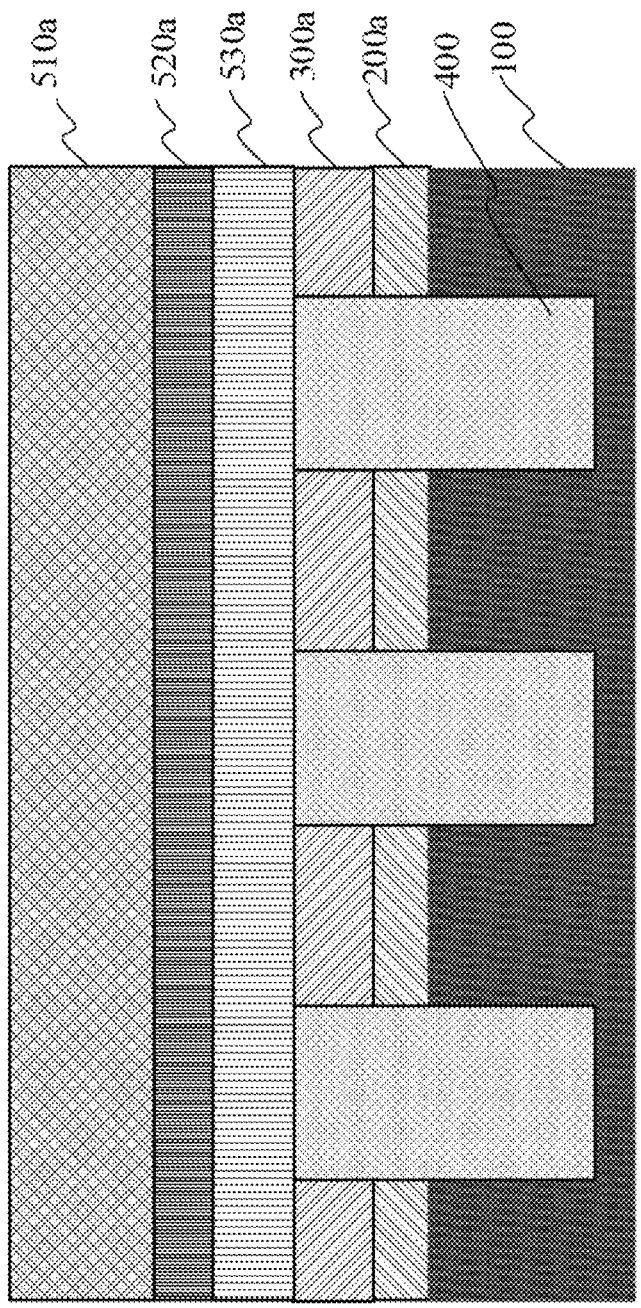
Figure 5B:
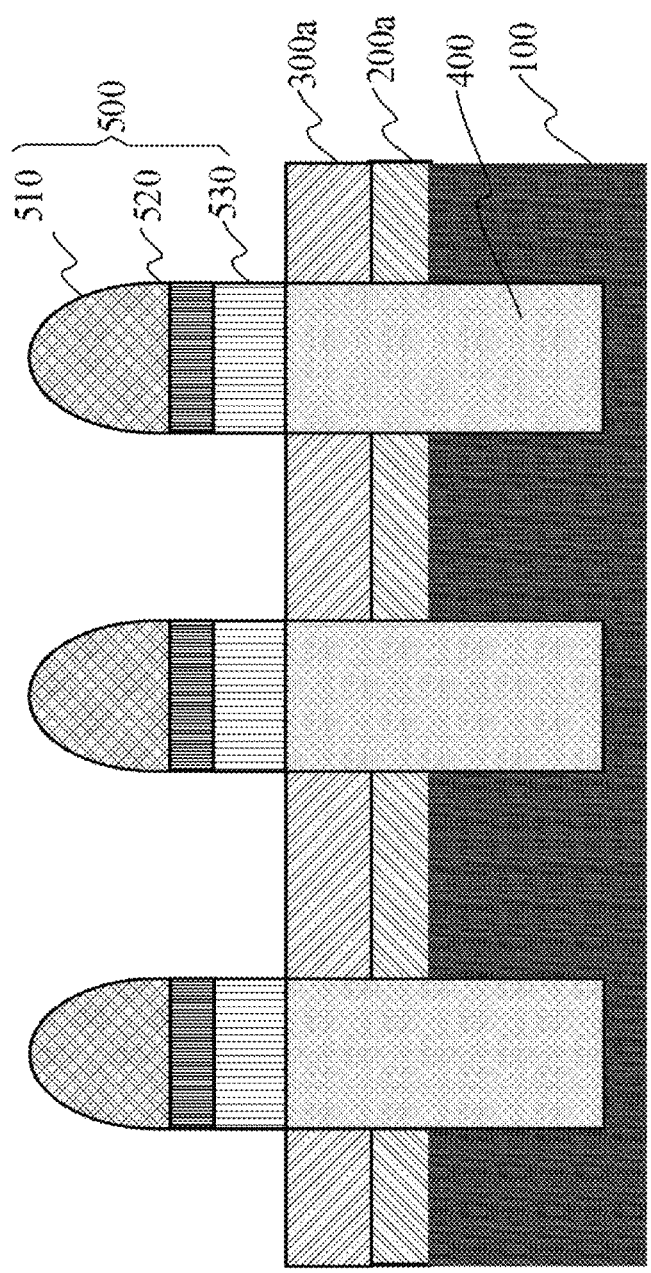

Referring to FIG. 5a and FIG. 5b, step S140 is performed to form a storage structure 500 on the first electrode 400.

In one of the embodiments, the storage structure 500 is a magnetic stacked layer structure. As shown in FIG. 5a, the magnetic stacked layer structure includes: a first magnetic layer 530a, a spacer material layer 520a, and a second magnetic layer 510a. These layers are sequentially deposited on the substrate 100 after the first electrode 400 is formed; then, as shown in FIG. 5b, the first magnetic layer 530a, the spacer material layer 520a, and the second magnetic layer 510a in FIG. 5a are patterned by photolithography and etching processes to form a magnetic stacked layer structure including a fixed layer 530, a spacer layer 520, and a free layer 510. Specifically, the materials of the first magnetic layer 530a and the second magnetic layer 510a include cobalt (Co), iron (Fe), boron (B), tantalum (Ta) or ruthenium (Ru); the material of the spacer material layer 520a includes magnesium (Mg) or oxygen (O). For example, the fixed layer 530 may be CoFeB, the spacer layer 520 may be a MgO, and the free layer 510 may be CoFeB.

In one of the embodiments, the number of the storage structures 500 and the number of the first electrodes 400 can both be multiples, and the first electrodes 400 and the storage structures 500 are arranged in a one-to-one correspondence; and the first electrodes 400 are distributed on the substrate 100 at intervals. The storage structures 500 have spaces between any two of them.

In one of the embodiments, the top surface of the magnetic stacked layer structure is arc-shaped. Specifically, the first magnetic layer 530a, the spacer material layer 520a, and the second magnetic layer 510a may be etched by an ion beam etching (IBE) process to form the magnetic stacked layer structure, and the top surface of the free layer 510 of the magnetic stacked layer structure is arc-shaped, which can increase the distance between the upper parts of the adjacent magnetic stacked layer structures, thus reduce the risk of adjacent magnetic stacked layer structures contacting each other, therefore increasing the product yield. At the same time, it is also conducive to better space filling of the subsequent third dielectric layer between the adjacent magnetic stacked layer structures.

Figure 8:
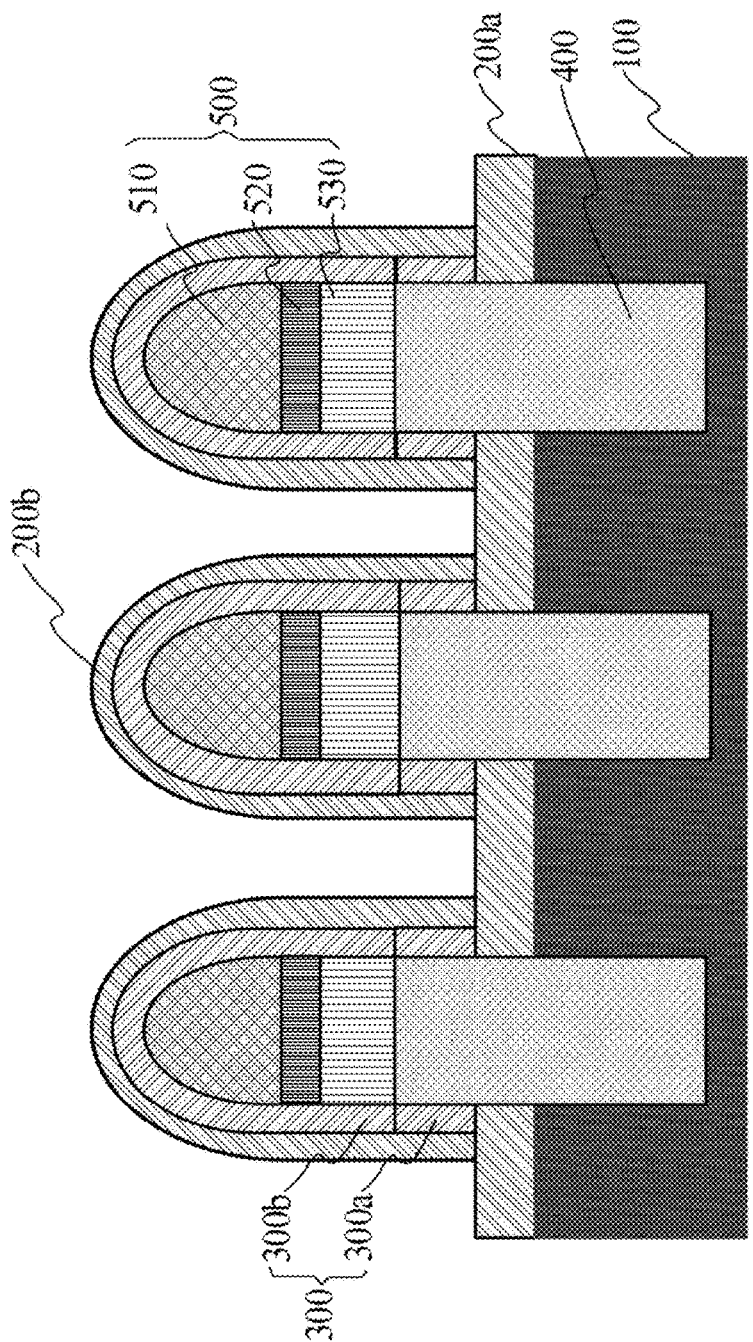

Referring to FIG. 8, step S150 is performed to form a second shielding layer 200b on the top and side walls of the storage structure, and the first shielding layer 200a and the second shielding layer 200b combine to form the shielding layer 200. Specifically, the step S150 includes: depositing a shielding material on the storage structure through a deposition process to form a second shielding layer 200b which covers the top surface and sidewalls of the storage structure. The second shielding layer 200b is connected to the first shielding layer 200a so they combine to be a shielding layer 200 on the storage structure 500. The deposition process includes chemical vapor deposition (CVD), physical vapor deposition (PVD), or atomic layer deposition (ALD). The shielding material can be a material with good conductivity, such as silver (Ag), copper (Cu), gold (Au), etc., these materials can play a good shielding effect on the electric field; the shielding material can also be a material with good magnetic permeability, such as iron (Fe), cobalt (Co) and nickel (Ni) and their alloys, such as cobalt-iron, nickel-iron and nickel-cobalt-iron, or various combinations of NiFe and Co and other alloys with higher magnetic permeability, doped amorphous ferromagnetic alloys and so like. It should be noted that the material with good conductivity can play an additional certain shielding effect on the magnetic field, and the material with good magnetic permeability can also play a certain shielding effect on the electric field.

Figure 9:
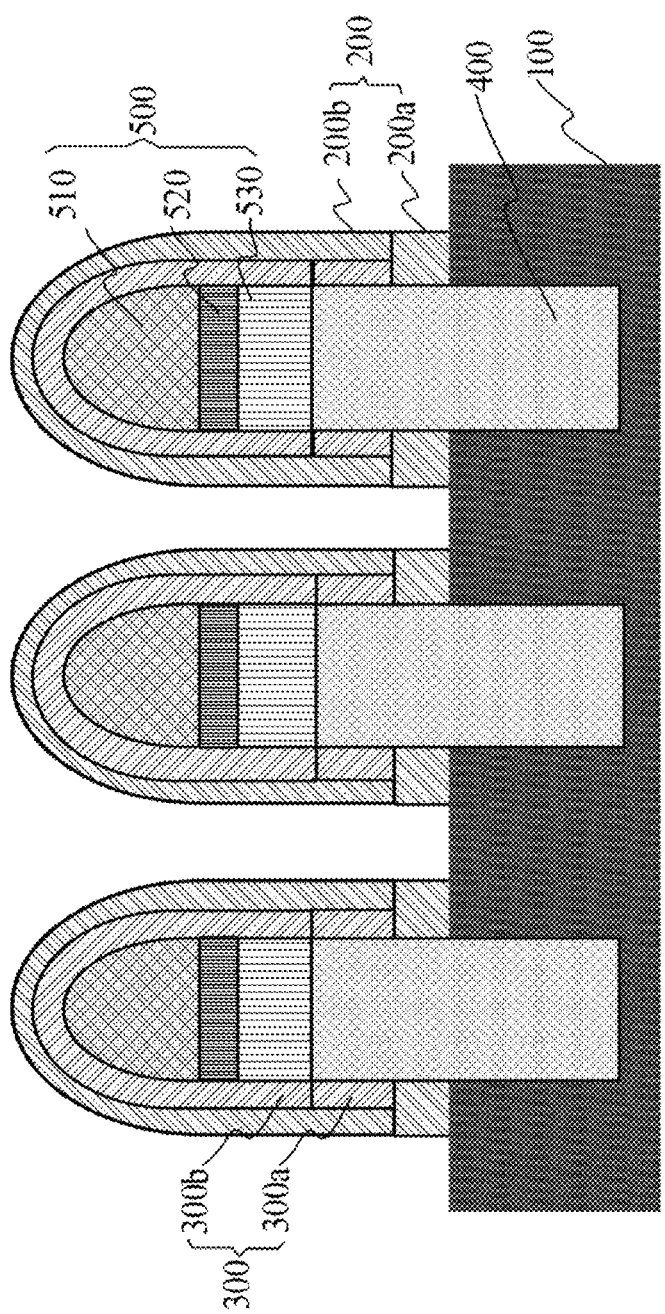

In one of the embodiments, the materials of the first shielding layer 200a and the second shielding layer 200b can be different. The first shielding layer 200a and the second shielding layer 200b are both materials with good magnetic permeability, but the materials of the first shielding layer 200a and the second shielding layer 200b are different. For example, the first shielding layer 200a is made of cobalt-iron, and the second shielding layer 200b is made of nickel-iron; or the first shielding layer 200a and the second shielding layer 200b are both materials with good conductivity, but the materials of the first shielding layer 200a and the second shielding layer 200b are different. For example, the first shielding layer 200a is silver, and the second shielding layer 200b is copper. Or the first shielding layer 200a is made of a material with good electric conductivity such as copper, and the second shielding layer 200b is made of a material with good magnetic permeability, such as nickel-iron. As shown in FIG. 9, the first shielding layer 200a and the second shielding layer 200b have an etch selection ratio, as self-aligned etching is used to remove part of the sidewalls of the magnetic stacked layer structure. The second shielding layer 200b is patterned and the first shielding layer 200a remains under the second shielding layer 200b. That is, the first shielding layer 200a and the second shielding layer 200b over the sidewalls of the magnetic stacked layer structure form the resultant shielding layer 200. This method can reduce process steps and save fabrication costs. At the same time, self-aligned etching can be used to prevent over-etching errors caused by the photolithography process and improve product yield.

Figure 6:
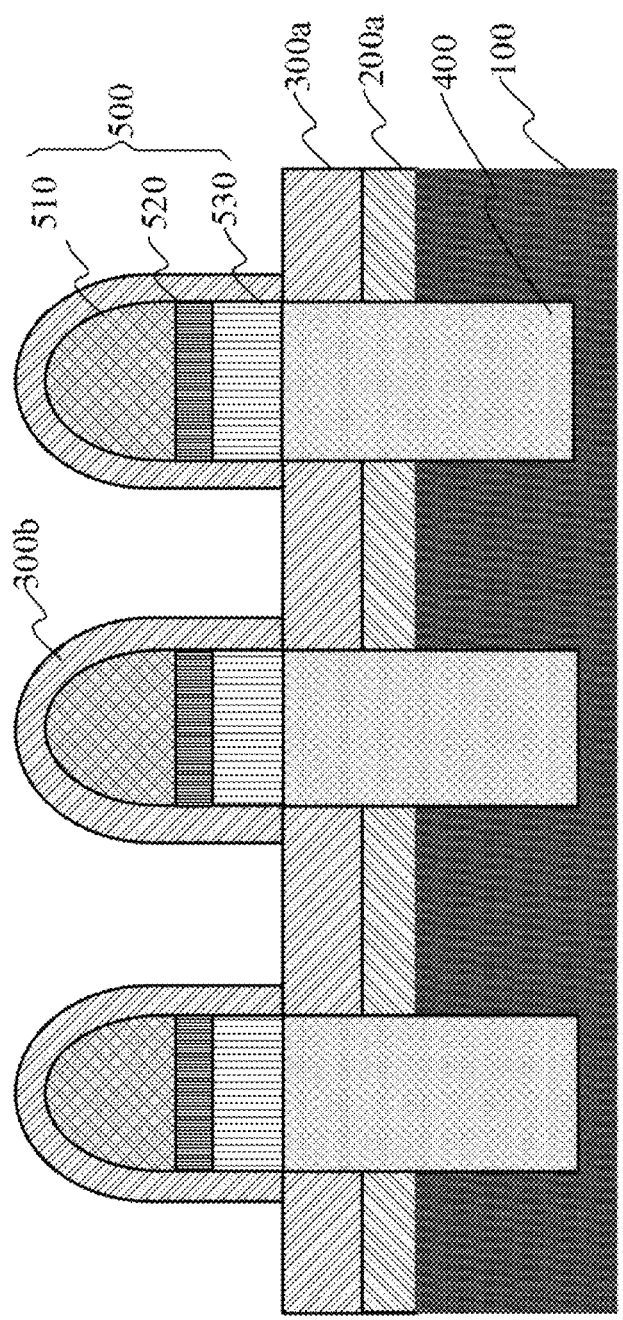
Figure 7:
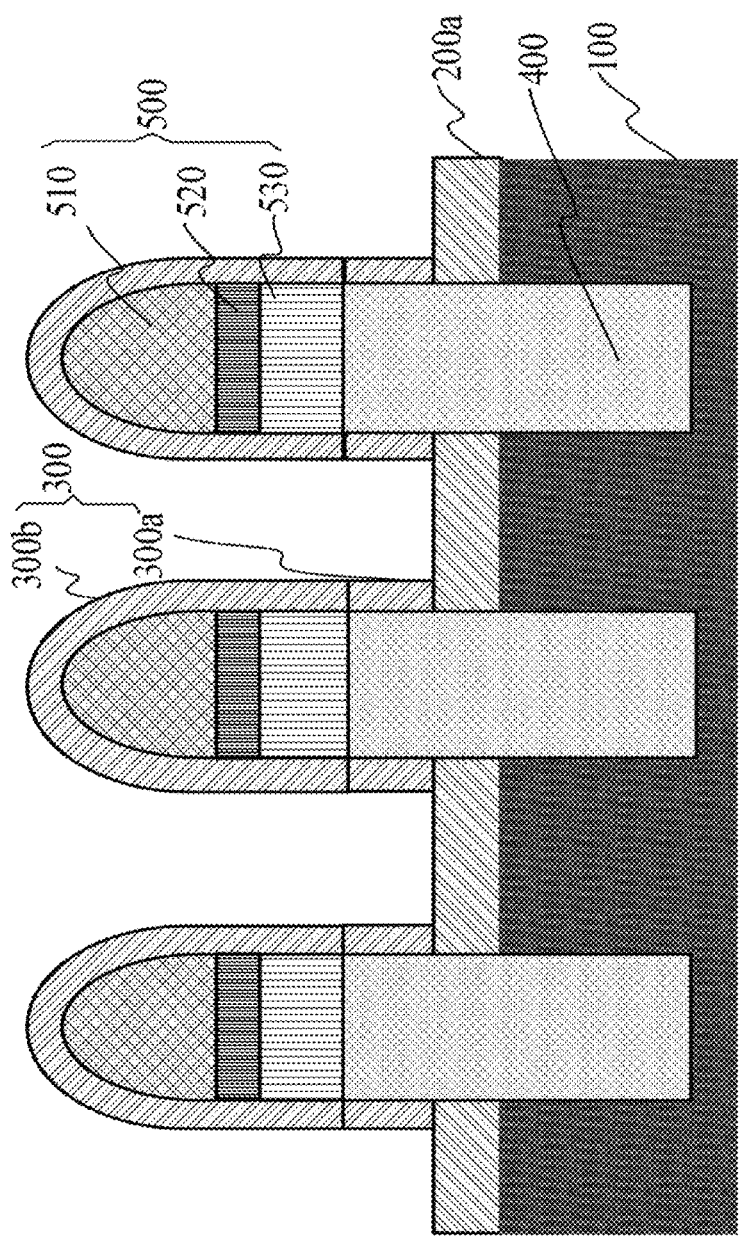

In one of the embodiments, referring to FIGS. 6 and 7, before the second shielding layer is formed on the top surface and sidewalls of the storage structure, the method further includes: forming a second shielding layer covering the top surface and sidewalls of the magnetic stacked layer structure 300b. Two dielectric layers, the first dielectric layer 300a and the second dielectric layer 300b together constitute an isolation layer 300. Specifically, the process includes: using a deposition process to deposit an isolation material, such as silicon oxide, silicon nitride, or silicon oxynitride, to form a second dielectric layer 300b covering the first dielectric layer 300a and the top surface and sidewalls of the magnetic stacked layer structure. Then, an etching process is used to remove the portion of the second dielectric layer 300b from the upper surface of the first dielectric layer 300a to form the portion of the second dielectric layer 300b covering only the top surface and sidewalls of the magnetic stacked layer structure. In this embodiment, referring to FIG. 7, the first dielectric layer 300a and the second dielectric layer 300b compose of the same material. Therefore, the first dielectric layer 300a and second dielectric layer between adjacent magnetic stacked layer structures can also be removed by one etching process, and the first dielectric layer 300a and the second dielectric layer 300b retain on the top surface and sidewalls of the magnetic stacked layer structures. The first dielectric layer 300a and the second dielectric layer 300b jointly constitute an isolation layer 300. The isolation layer can relieve the stress of the shielding layer 200 and isolate the shielding layer 200 from the magnetic stacked layer structure.

Figure 13:
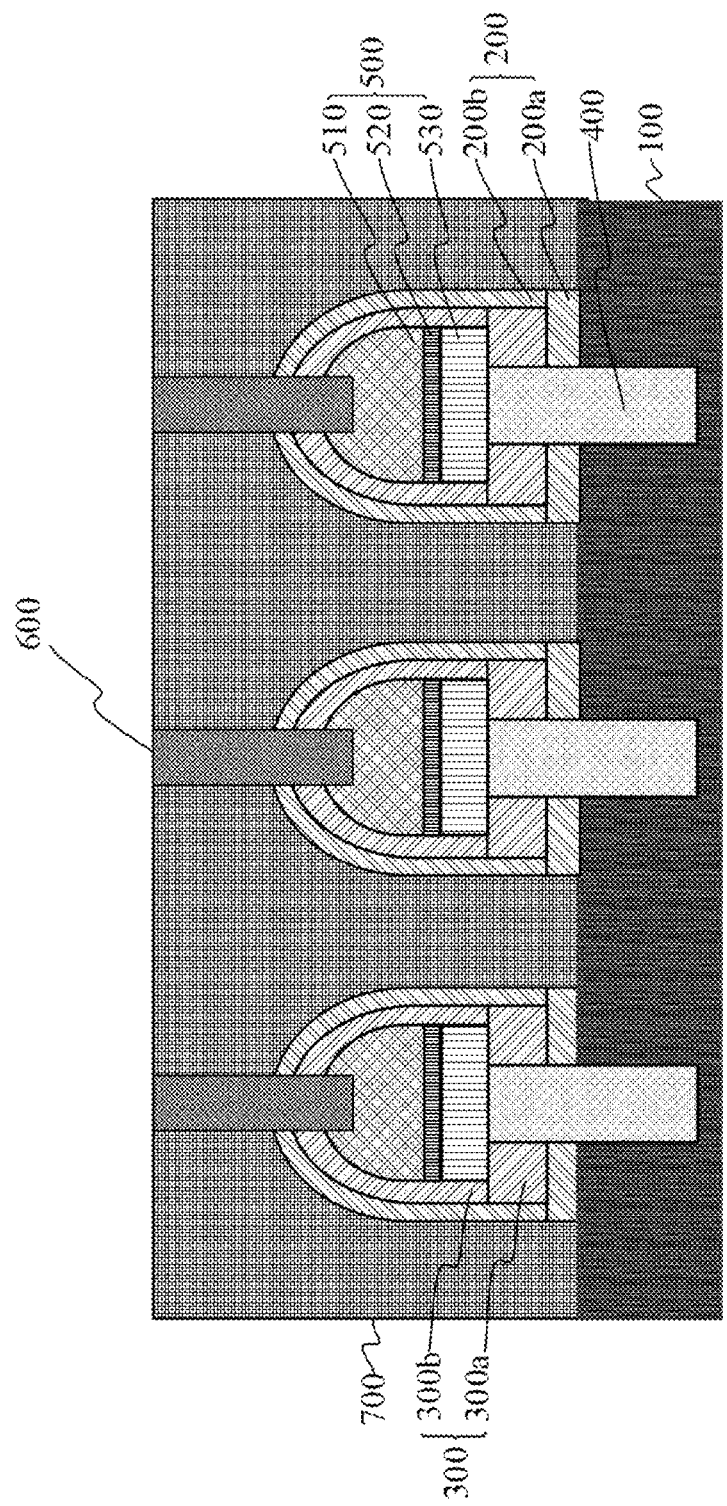
FIG. 13 is a schematic structural diagram of a semiconductor structure according to another embodiment.

In one of the embodiments, the lateral dimension of the magnetic stacked layer structure is larger than the lateral dimension of the first electrode. Specifically, as shown in FIG. 13, the size of the magnetic in the direction along the surface of the substrate 100 is larger than the size of the first electrode 400 in the direction along the surface of the substrate 100, so that a part of the shielding layer 200 is also formed between the substrate 100 and the magnetic stacked layer structure. The formed shielding layer 200 also has a certain shielding effect at the bottom of the magnetic stacked layer structure to enhance the shielding effect.

Figure 10:
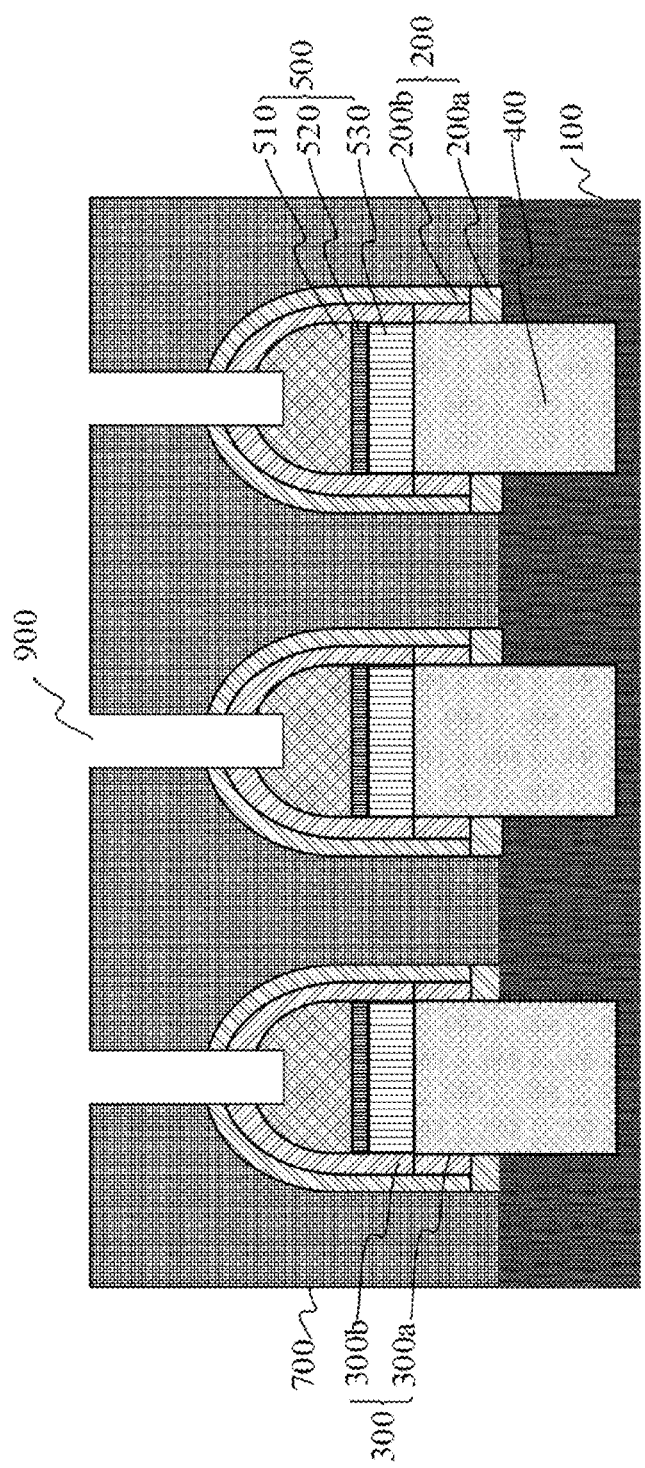
Figure 12:
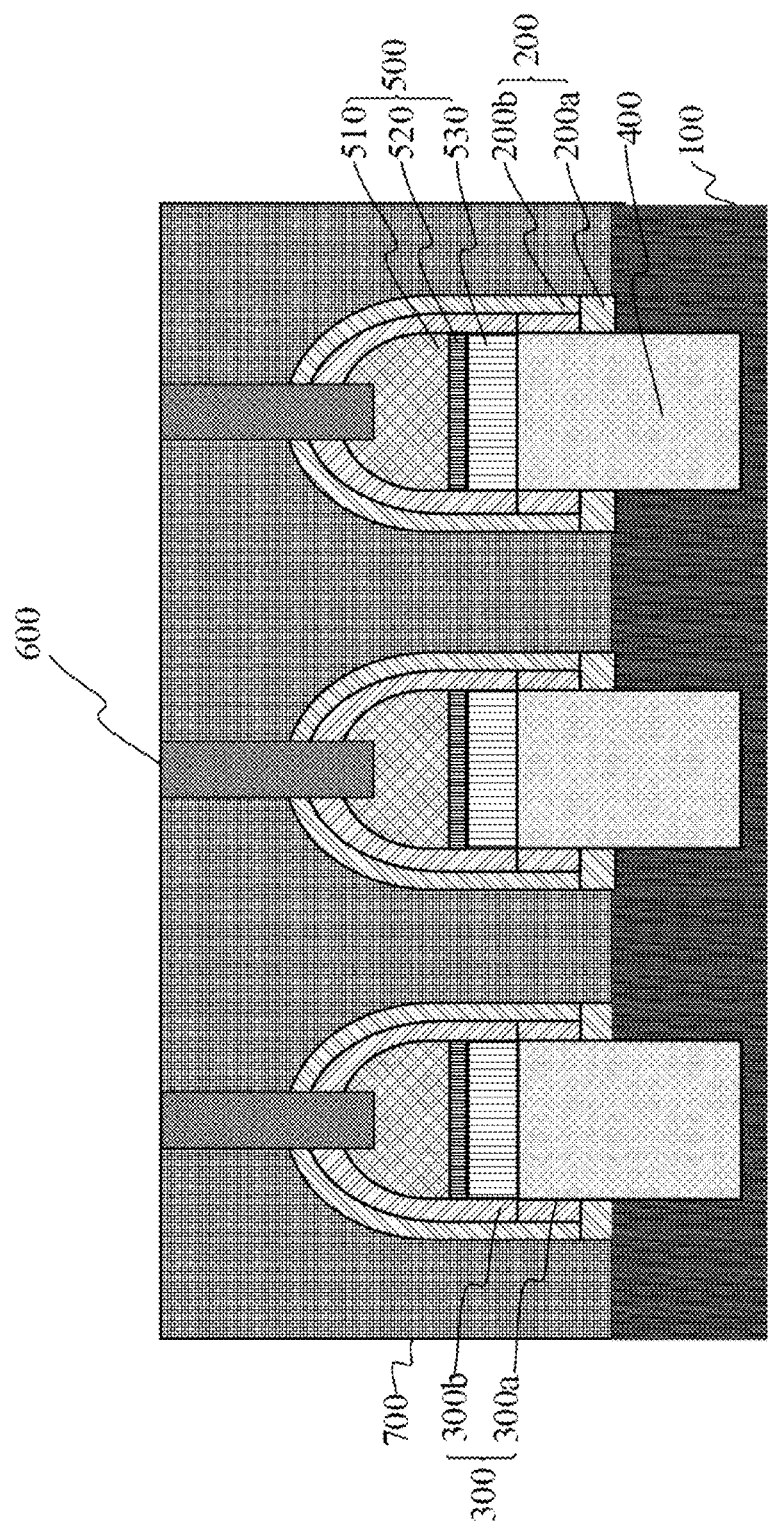
FIG. 12 is a schematic structural diagram of a semiconductor structure according to one embodiment.

Referring to FIGS. 10 and 12, step S160 is performed to form a second electrode 600 that penetrates the shielding layer 200 and is electrically connected to the storage structure. Specifically, step S160 includes: forming a third dielectric layer 700 on the substrate 100 and the storage structure; forming a third opening 900 in the third dielectric layer 700 to expose the top of the storage structure 500 through photolithography and etching processes. Finally, the third opening 900 is filled with a conductive material, and the conductive material on the surface of the third dielectric layer 700 is removed by an etch-back or a chemical mechanical polishing process to form the second electrode 600. The second electrode layer may be a metal material layer with good conductivity such as Al, W, and Cu.

Figure 11:
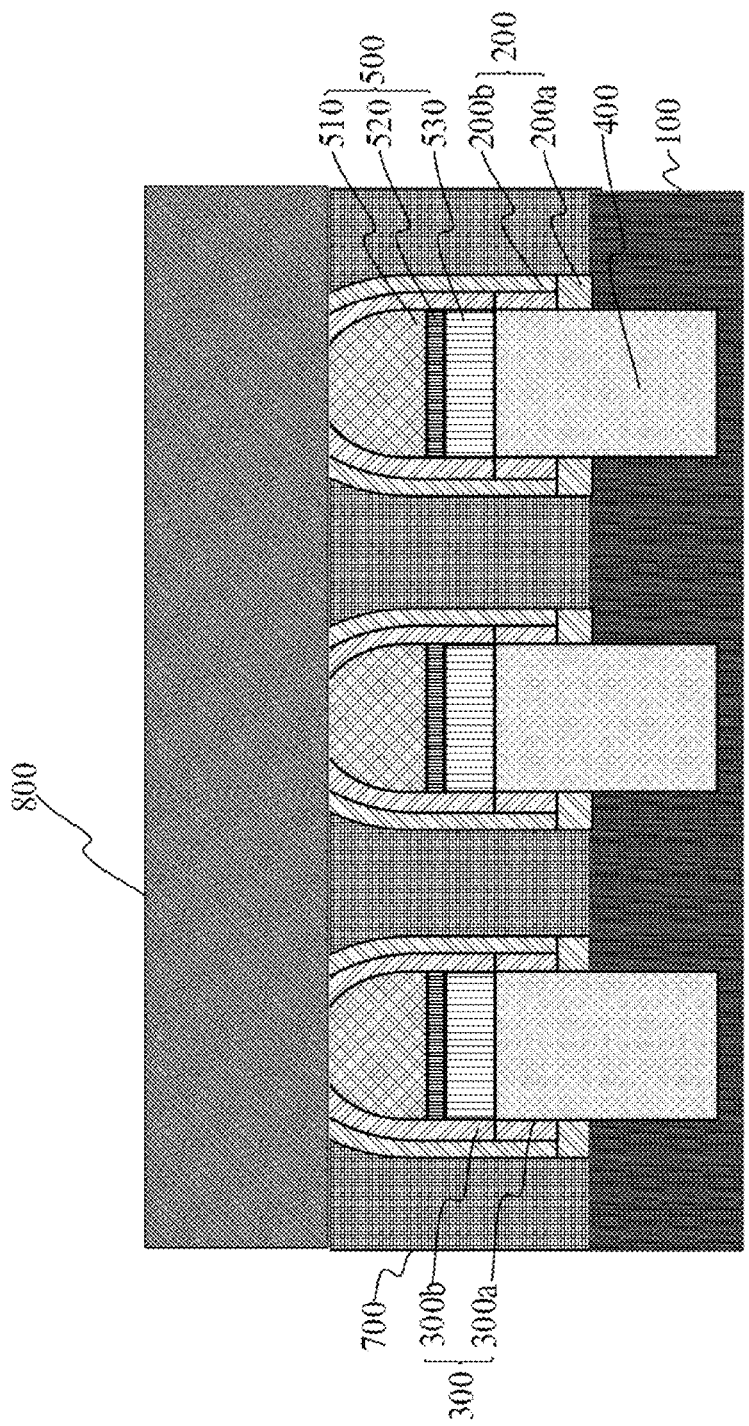
Figure 14:
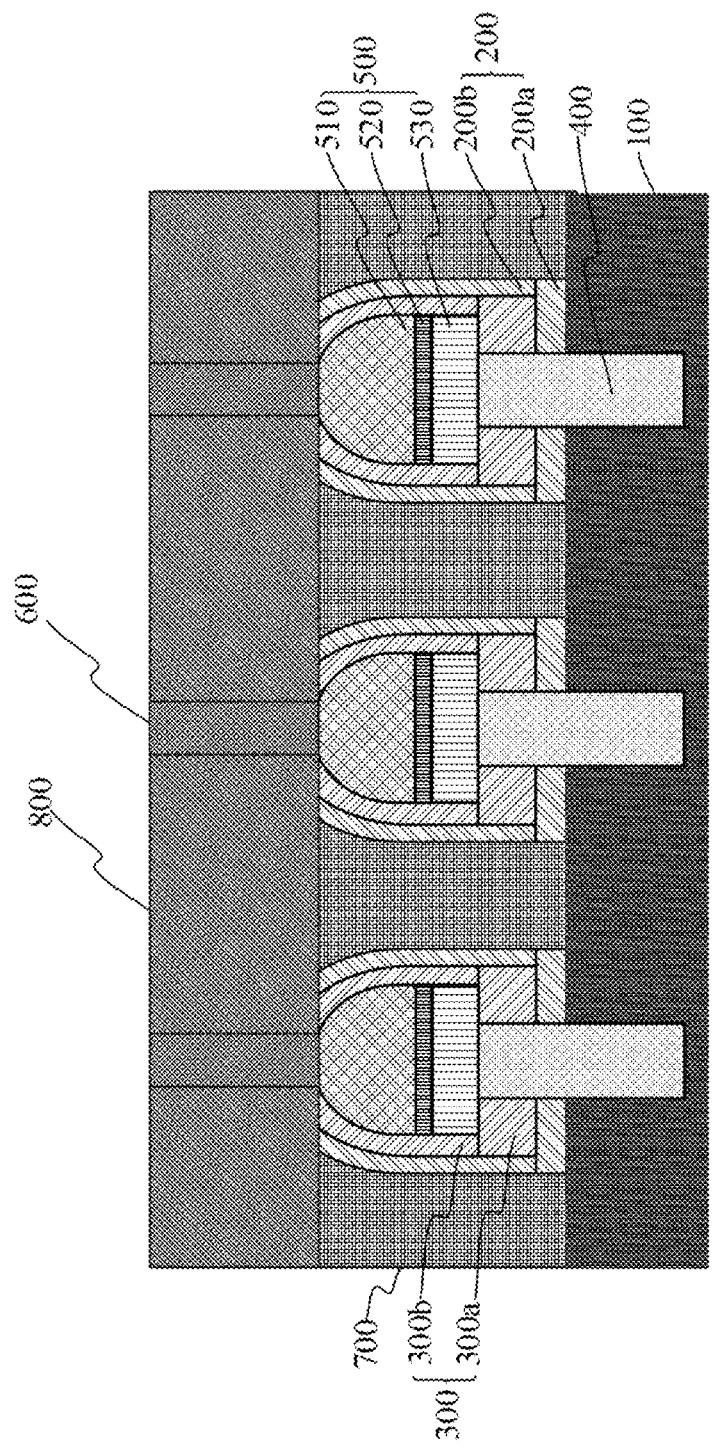
FIG. 14 is a schematic structural diagram of a semiconductor structure according to yet another embodiment.

In one of the embodiments, as shown in FIG. 11 and FIG. 14, the method further includes forming a second electrode that penetrates the shielding layer and is electrically connected to the storage structure. The storage structure is a magnetic stacked layer structure. The top of the stacked layer structure is arc-shaped. The third dielectric layer 700 is formed on the substrate as well as the magnetic stacked layer structure. A part of the shielding layer above the magnetic stacked layer structure is removed by a planarization process to expose the magnetic stacked layer top. The fourth dielectric layer 800 is formed on the top of the magnetic stacked layer structure. A second opening (not shown in the figure) is formed in the fourth dielectric layer 800 to expose the top of the magnetic stacked layer structure. The second electrode 600 is formed in the second opening. Using a planarization process to remove part of the shielding layer above the magnetic stacked layer structure to expose the top of the magnetic stacked layer structure can simplify the manufacturing process. At the same time, when the second opening is subsequently formed, the shielding layer and the isolation layer are etched to reduce damage to the magnetic stacked layer structure; while the arc-shaped top structure can make the non-exposed area of the magnetic stacked layer structure when the top of the magnetic stacked layer structure is exposed by a planarization process. The external unexposed isolation layer and shielding layer will not be removed, thereby enhancing the shielding effect. In this embodiment, the bottom surface of the second electrode 600 and the top surface of the magnetic stacked layer structure, the top surface of the shielding layer 200 and the top surface of the isolation layer 300 are on the same horizontal plane.

Based on the same inventive concept, a semiconductor structure is also provided. Referring to FIG. 12, the semiconductor structure includes: a substrate 100, a first electrode 400, a storage structure 500, a shielding layer 200, and a second electrode 600. The first electrode 400 is located in the substrate 100; the storage structure 500 is located on the first electrode 400; the shielding layer 200 covers the top surface and sidewalls of the storage structure 500, and the bottom surface of the shielding layer 200 is lower than the bottom surface of the storage structure 500; the second electrode 600 penetrates the shielding layer 200 into the top of the storage structure 500 and is electrically connected to the storage structure 500.

The shielding layer 200 covers the storage structure 500, which can better shield the interference of the external electromagnetic field on the storage structure 500, and ensure that information can be stored and read and written correctly. The substrate 100 may be one of, but not limited to, a silicon substrate, an epitaxially grown silicon substrate, a silicon germanium substrate, a silicon carbide substrate, or a silicon-on-insulator substrate. The substrate 100 may include device structures, such as semiconductor transistors and interconnecting contacts to connect the semiconductor transistors.

In one of the embodiments, there are multiple storage structures 500, multiple first electrodes 400, and multiple second electrodes 600. The first electrode 400 and the second electrode 600 are arranged in a one-to-one correspondence with the storage structure 500. There are spaces between any two of the storage structures 500. The semiconductor structure further includes a third dielectric layer 700 disposed on the substrate 100, and the spaces between two of the storage structures 500 are filled to isolate two adjacent second electrodes 600 and two adjacent shielding layers 200. In this embodiment, the third dielectric layer 700 may be formed of dielectric materials such as silicon nitride, silicon oxide, or silicon oxynitride.

In one of the embodiments, the storage structure 500 is a magnetic stacked layer structure. The magnetic stacked layer structure at least includes a free layer 510, a spacer layer 520, and a fixed layer 530 stacked from top to bottom. Specifically, the materials of the free layer 510 and the fixed layer 530 include Co, Fe, B, Ta or Ru; the material of the spacer layer includes Mg or O. For example, the fixed layer 530 may be CoFeB, the spacer layer may be a MgO layer, and the free layer 510 may be CoFeB.

In one of the embodiments, an isolation layer 300 is further included, and the isolation layer 300 is at the magnetic stacked layer structure. Specifically, the isolation layer 300 includes a first dielectric layer 300a and a second dielectric layer 300b; the first dielectric layer 300a is located between the shielding layer 200 and the first electrode 400; the second dielectric layer 300b is located between the shielding layer 200 and the magnetic stacked layer structure.

In one of the embodiments, the top of the magnetic stacked layer structure is arc-shaped. As shown in FIG. 12, the top of the magnetic stacked layer structure is arc-shaped, and the top surfaces of the isolation layer 300 and the shielding layer 200 covered thereon are also arc-shaped. Specifically, the arc shape is outwardly protruding, and the top surface of the free layer 510 in the magnetic stacked layer structure has an arc shape. This structure keeps a larger distance between tops of two adjacent magnetic stacked layer structures, thus reducing the risk of adjacent magnetic stacked layer structures contacting each other, and increasing the product yield. At the same time, it also facilitates filling the third dielectric layer 700 in the spaces between any two of the adjacent magnetic stacked layer structures. In addition, as shown in FIG. 14, the arc-shaped magnetic stacked layer structure tops can prevent the isolation layer 200 and the shielding layer 300 outside the non-exposed region of the magnetic stacked layer structure from being removed when the magnetic stacked layer structure top is exposed by a planarization process. As the result, the shielding effect is enhanced.

In some of the embodiments, the lateral dimension of the magnetic stacked layer structure is larger than the lateral dimension of the first electrode. As shown in FIG. 13, the dimension of the magnetic stacked layer structure parallel to the surface of the substrate 100 is larger than the dimension of the first electrode 400 parallel to the surface of the substrate 100, so that a part of the shielding layer 200 is also formed between the substrate 100 and the magnetic stacked layer structure, that is, a part of the shielding layer 200 is also formed at the bottom of the magnetic stacked layer structure and the shielding layer 200 also plays a certain shielding role at the bottom of the magnetic stacked layer structure, increasing the total shielding effect.

In one of the embodiments, as shown in FIG. 13, the shielding layer 200 includes a first shielding layer 200a and a second shielding layer 200b; the first shielding layer 200a is located between the first dielectric layer 300a and the liner. Between the substrate 100, one end of the first shielding layer 200a is located in the projected area of the magnetic stacked layer structure on the substrate 100; the second shielding layer 200b is located on the outer surface of the sidewalls and the outer surface of the second dielectric layer 300b of the first dielectric layer 300a. The ends of the first shielding layer 200a and the second shielding layer 200b are connected to form a shielding layer 200 covering the top, sidewalls and part of the bottom surface of the magnetic stacked layer structure.

In one of the embodiments, the material of the first shielding layer 200a and the second shielding layer 200b can be one with good conductivity, such as silver, copper, gold, etc., which can effectively shield the electric field. The materials of the first shielding layer 200a and the second shielding layer 200b may also be materials with good magnetic permeability, such as alloys including iron (Fe), cobalt (Co), and nickel (Ni), or cobalt-iron, nickel-iron, and nickel, cobalt iron, various combinations of NiFe and Co alloys with higher magnetic permeability, doped amorphous ferromagnetic alloys, etc. It should be noted that the material with good conductivity can also play a certain shielding effect on the magnetic field, and the material with good magnetic permeability can also play a certain shielding effect on the electric field.

In one of the embodiments, the materials of the first shielding layer 200a and the second shielding layer 200b are different. For example, the first shielding layer 200a and the second shielding layer 200b may be both materials with good magnetic permeability. The materials of the first shielding layer 200a and the second shielding layer 200b can also be different, for example, the first shielding layer 200a and the second shielding layer 200b may be made of different materials. The layer 200a is cobalt-iron, and the second shielding layer 200b is nickel-iron; or the first shielding layer 200a and the second shielding layer 200b are both materials with good conductivity, but the first shielding layer 200a and the second shielding layer 200b may have different materials. For example, the first shielding layer 200a is silver and the second shielding layer 200b is copper; or the first shielding layer 200a is a material with good conductivity, such as copper. The second shielding layer 200b is made of a material with good magnetic permeability, such as nickel-iron. As shown in FIG. 9, the first shielding layer 200a and the second shielding layer 200b have different etch rates which presents an etch selection ratio. A self-aligned etching process is used to remove the first shielding layer 200a out of the sidewalls of the first electrode 400. The first shielding layer 200a and the second shielding layer 200b remaining next to the sidewalls of the first electrode 400 form the resultant shielding layer 200. This method can reduce process steps and save costs. At the same time, self-aligned etching can be used to prevent over-etching errors caused by the photolithography process and improve product yield.

In one of the embodiments, as shown in FIG. 14, the bottom surface of the second electrode 600 is in contact with the top surface of the magnetic stacked layer structure, the top surface of the shielding layer 200, and the top surface of the isolation layer 300 on the same level. Specifically, as shown in FIGS. 11 and 14, the storage structure 500 is a magnetic stacked layer structure; the top of the magnetic stacked layer structure is arc-shaped. A third dielectric layer 700 is formed on the substrate 100 and the magnetic stacked layer structure. A planarization process is used to remove part of the shielding layer 200 from above the magnetic stacked layer structure to expose the top of the magnetic stacked layer structure; a fourth dielectric layer 800 is formed on the top surface of the magnetic stacked layer structure. A second opening (not shown) is formed in the fourth dielectric layer 800 to expose the top of the magnetic stacked layer structure; the second electrode 600 is formed in the second opening. Using a planarization process to remove part of the shielding layer 200 above the magnetic stacked layer structure to expose the top can simplify the manufacturing process, and at the same time, when the second opening is subsequently formed, the shielding layer and the isolation layer are etched to reduce damage to the magnetic stacked layer structure. The arc-shaped top structure can make the magnetic stacked layer structure unexposed when the top of the magnetic stacked layer structure is exposed by a planarization process. The isolation layer 300 and the shielding layer 200 outside the area will not be removed, thereby enhancing the shielding effect. In this embodiment, the bottom surface of the second electrode 600 and the top surface of the magnetic stacked layer structure, the top surface of the shielding layer 200 and the top surface of the isolation layer 300 share the same horizontal plane.

The technical features of the above-mentioned embodiments can be combined arbitrarily. In order to make the description concise, not all possible combinations of the various technical features in the above-mentioned embodiments are described. However, as long as there is no contradiction in the combination of these technical features, all should be considered as in the scope of this specification.

The above-mentioned embodiments only express several embodiments of the present invention, and the descriptions are relatively specific and detailed, but they should not be interpreted as limiting the scope of the invention patent. It should be pointed out that for those of ordinary skill in the art, without departing from the concept of the present invention, several modifications and improvements can be made, and these all fall within the protected scope of the present invention. Therefore, the protection scope of the present disclosure should be subject to the appended claims.

The invention claimed is:

1. A method for manufacturing a semiconductor structure, comprising:
   providing a substrate;
   forming a first shielding layer on the substrate;
   forming a first electrode, wherein the first electrode penetrates the first shielding layer;
   forming a storage structure on the first electrode;
   forming a second shielding layer on a top surface and side walls of the storage structure, wherein the first shielding layer and the second shielding layer combine to form a shielding layer; and
   forming a second electrode, wherein the second electrode penetrates the shielding layer and electrically connects to the storage structure;
   wherein the storage structure comprises a magnetic stacked layer structure;
   wherein the forming the first electrode which penetrates the first shielding layer comprises:
   forming a first dielectric layer on the first shielding layer; and
   forming a first opening through the first dielectric layer and the first shielding layer, wherein the first electrode is formed in the first opening.

2. The method of claim 1, wherein before forming the second shielding layer on the top surface and sidewalls of the storage structure, the method further comprises:
   forming a second dielectric layer on the top surface and sidewalls of the magnetic stacked layer structure, wherein the first dielectric layer and the second dielectric layer combine to form an isolation layer.

3. The method of claim 2, wherein a material of the first shielding layer and a material of the second shielding layer each comprises a conductive material or a magnetically permeable material.

4. The method of claim 3, wherein the material of the first shielding layer is different from the material of the second shielding layer;
   wherein the method further comprises applying a self-aligned etching process on the first shielding layer, wherein the self-aligned etching process removes the first shielding layer located outside the second shielding layer on the sidewalls of the magnetic stacked layer structure; and
   wherein the first shielding layer aligns with the second shielding layer after the self-aligned etching process.

5. The method of claim 4, wherein a bottom surface of the shielding layer is located below a bottom surface of the magnetic stacked layer structure.

6. The method of claim 2, wherein the top surface of the magnetic stacked layer structure is arc-shaped.

7. The method of claim 2, wherein a lateral dimension of the magnetic stacked layer structure is larger than a lateral dimension of the first electrode, and wherein the lateral dimension is parallel to a top surface of the substrate.

8. The manufacturing method of claim 6, wherein the forming a second electrode that penetrates the shielding layer and is electrically connected to the storage structure comprises:
   forming a third dielectric layer on the substrate and the shielding layer;
   applying a planarizing process to remove a part of the shielding layer from above the magnetic stacked layer structure to expose the top surface of the magnetic stacked layer structure;
   forming a fourth dielectric layer on the top surface of the magnetic stacked layer structure; and forming a second opening in the fourth dielectric layer to expose the top surface of the magnetic stacked layer structure, wherein the second electrode is formed in the second opening.

9. A semiconductor structure, including:
a substrate;
a first electrode disposed in the substrate;
a storage structure formed on the first electrode;
a shielding layer formed on a top surface and sidewalls of the storage structure, and the bottom surface of the shielding layer is lower than the bottom surface of the storage structure; and
a second electrode disposed on the top surface of the storage structure, wherein the second electrode penetrates the shielding layer and electrically connects to the storage structure;
wherein the storage structure comprises a magnetic stacked layer structure;
an isolation layer disposed on the magnetic stacked layer structure;
wherein the isolation layer comprises a first dielectric layer and a second dielectric layer, wherein the first dielectric layer is disposed between the shielding layer and the first electrode, and wherein the second dielectric layer is disposed between the shielding layer and the magnetic stacked layer structure;
wherein a lateral dimension of the magnetic stacked layer structure is larger than a lateral dimension of the first electrode, and wherein the lateral dimension is parallel to a top surface of the substrate.

10. The semiconductor structure of claim 9, wherein the magnetic stacked layer structure comprises a fixed layer, a spacer layer, and a free layer.

11. The semiconductor structure of claim 10, wherein materials of the fixed layer and the free layer comprise Co, Fe, B, Ta or Ru; and wherein a material of the spacer layer comprises Mg or O.

12. The semiconductor structure of claim 9, wherein the top surface of the magnetic stacked layer structure is arc-shaped.

13. The semiconductor structure of claim 9, wherein the shielding layer comprises a first shielding layer and a second shielding layer;
wherein the first shielding layer is disposed between the first dielectric layer and the substrate, and wherein one end of the first shielding layer is disposed on the substrate in a projected area of the magnetic stacked layer structure; and
wherein the second shielding layer is disposed on an outer surface of a sidewall of the first dielectric layer and an outer surface of the second dielectric layer.

14. The semiconductor structure of claim 13, wherein a material of the first shielding layer and a material of the second shielding layer each comprises a conductive material or a magnetically permeable material; and wherein the material of the first shielding layer and the material of the second shielding layer are different.

15. The semiconductor structure of claim 9, wherein a bottom surface of the second electrode, the top surface of the magnetic stacked layer structure, the top surface of the shielding layer, and a top surface of the isolation layer are on the same level.

* * * * *